United States Patent [19]

Suga et al.

[11] Patent Number: 5,789,935
[45] Date of Patent: Aug. 4, 1998

[54] MOTOR EVALUATION DATA GENERATING METHOD WITH RESPONSE DELAY COMPENSATION

[75] Inventors: Hiroshi Suga, Toyoake; Yasutomo Kawabata, Aichi-ken, both of Japan

[73] Assignee: Toyota Jidosha Kabushiki Kaisha, Toyota, Japan

[21] Appl. No.: 509,467

[22] Filed: Jul. 31, 1995

[30] Foreign Application Priority Data

Sep. 1, 1994 [JP] Japan .................. 6-208928

[51] Int. Cl.$^6$ .................................................. G01R 17/02
[52] U.S. Cl. .................................. 324/772; 364/571.01
[58] Field of Search .................................. 324/73.1, 772, 324/158.1, 545, 612, 621, 620; 364/571.01, 551; 318/490, 696; 73/116, 862.18

[56] References Cited

U.S. PATENT DOCUMENTS

| | | | |
|---|---|---|---|
| 2,905,886 | 9/1959 | Hupert et al. | 324/620 |
| 2,980,853 | 4/1961 | Kline et al. | 324/612 |
| 3,404,338 | 10/1968 | Cannon | 324/620 |
| 3,711,769 | 1/1973 | Peake | 324/612 |
| 3,898,875 | 8/1975 | Knoop et al. | |
| 4,063,112 | 12/1977 | Dumbeck | 318/490 |
| 4,257,261 | 3/1981 | Ono et al. | |
| 4,382,388 | 5/1983 | Ono | |
| 4,422,040 | 12/1983 | Raider et al. | 318/490 |
| 4,442,708 | 4/1984 | Gable et al. | |
| 4,672,288 | 6/1987 | Abbondanti | 324/772 |
| 4,860,231 | 8/1989 | Ballard et al. | 324/772 |
| 4,965,513 | 10/1990 | Haynes et al. | 324/772 |
| 5,262,717 | 11/1993 | Bolegoh | 324/772 |

FOREIGN PATENT DOCUMENTS

| | | |
|---|---|---|
| 59-104571 | 6/1984 | Japan . |
| 59-111071 | 6/1984 | Japan . |
| 61-469 | 1/1986 | Japan . |
| 3-212194 | 9/1991 | Japan . |
| 6-66653 | 3/1994 | Japan . |

*Primary Examiner*—Vinh P. Nguyen
*Attorney, Agent, or Firm*—Oblon, Spivak, McClelland, Maier & Neustadt, P.C.

[57] ABSTRACT

A method of evaluating a motor. Prior to testing the motor, the following factors are measured as essential properties of the motor, e.g. a correlation between a reference current and a motor current, reaction of the motor current, etc. in response to a variation of the reference current, a correlation between the reference current and a motor torque, temperature characteristics of the motor torque, a relationship between the torque, the number of rotations, efficiency of the motor, and so on. The measured essential properties include response delays of an evaluator and sensors, and influences of disturbances such as temperature. Data collected during testing are corrected on the basis of the measured essential properties using the reference currents as time criteria such that influences caused by response delays can be excluded. Thus, the performances of the motor can be precisely analyzed.

12 Claims, 10 Drawing Sheets

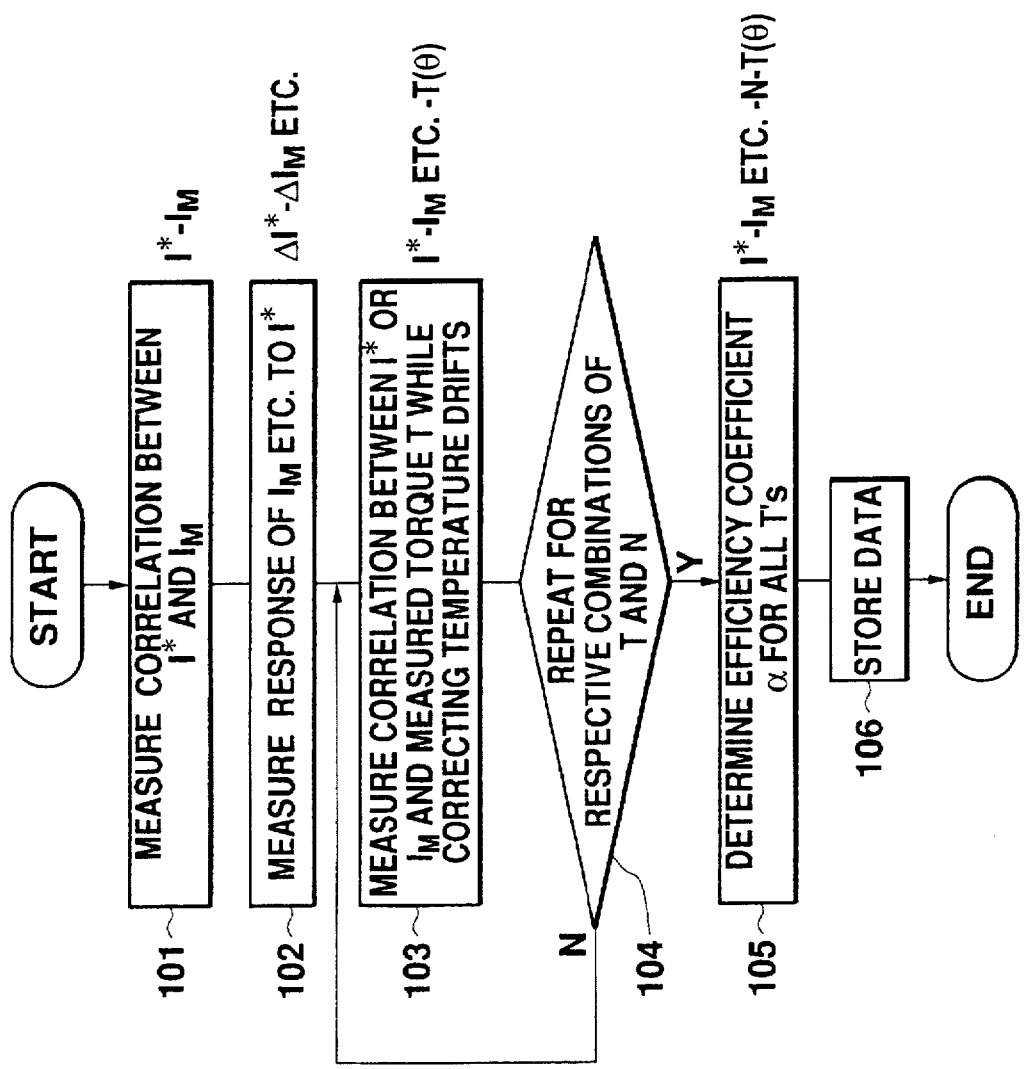

5,789,935

MOTOR EVALUATION DATA GENERATING METHOD WITH RESPONSE DELAY COMPENSATION

DETAILED DESCRIPTION OF THE INVENTION

1. Field of the Invention

This invention relates to a method of evaluating performance characteristics of a motor mounted in an electric vehicle, and more particularly to a method of collecting data concerning the motor which is being evaluated.

2. Description of the Related Art

Japanese Patent Laid-Open Publication No. Hei 3-212194 discloses a method of evaluating a motor, for example, in which a motor (load motor) is used to apply a load to a motor to be tested (called "a specimen motor" hereinafter). To evaluate the specimen motor, an evaluator should have a variety of sensors at various parts thereof so as to detect states of itself and the specimen motor as well as reaction of the motor in response to variations of command values.

A method, disclosed in Japanese Patent Laid-Open Publication No. Hei 6-66653, is applicable to recognizing properties of a specimen motor to be tested. With the cited method, a torque and the number of rotations of the specimen motor are detected as well as an input thereto. A product of the torque and the number of rotations represents an output of the specimen motor. Thus, efficiency of the specimen motor can be ascertained on the basis of detected values of the input, torque and the number of rotations.

However, it is usually inevitable that systems including sensors such as a torque sensor for detecting properties of the specimen motor or the evaluator have certain response delays. In other words, not only the specimen motor but also an inverter for actuating the specimen motor, or sensors undergo response delays. Therefore, even when certain command values (e.g. an output torque command, motor current command, etc.) are applied to the specimen motor at a certain time point, responses to the command values are not always obtainable immediately but are only available after a certain delay.

If the response delays become too long to be ignored with respect to a command output cycle or a command renewal cycle, it is impossible to accurately analyze data on the properties of concerned units and devices which are obtained during the evaluation. Especially, when the command values are rapidly varied (i.e. an output cycle is significantly short), the foregoing problem is remarkable. Further, a plurality of sensors have different response delays peculiar to themselves so that responses to certain command values are obtained at different time points in respective sensors. Therefore, this makes it even more difficult to analyze the data accurately. Still further, disturbances such as temperatures also adversely affect the responses, which means that accurate analysis becomes even more difficult.

SUMMARY OF THE INVENTION

The present invention is intended to collect information of a measured specimen such that collected information is accurately analyzed and response delays contained in the measured information can be precisely compensated.

According to a first aspect of the invention, there is provided a method of evaluating a motor, comprising: a first step of preliminarily collecting response delay information in connection with preliminary commands, the response delay representing time points when detected values vary in response to varying the preliminary commands; a second step of detecting and collecting, in synchronization with testing commands, operation status information representing an operating status of a specimen motor when the specimen motor is actuated in response to the testing commands and the commands are issued periodically; and a step of aligning the operating status information on the basis of the response delay information on a single time axis.

According to the present invention, information collected through actual testing aligned on the single time axis on the basis of the response delay information which represent time points where detected values vary in response to preliminary commands, and by using the testing commands as time criteria. Thus, it is possible to correct response delays of the specimen motor and systems for operating the specimen motor on the basis of the response delay information. Therefore, it is possible to analyze reactions of the specimen motor in response to testing commands which are changed at a high speed. In other words, even when the specimen motor is a vehicle driving motor of an electric vehicle which should be driven at a high speed, the properties of the specimen motor can be analyzed precisely and correctly.

In a second aspect of the invention, the method further comprises a third step of preliminarily storing relationships between output torques of the specimen motor and the preliminary commands, and a fourth step of aligning stored output torques and the operating status information on the single time axis on the basis of the operating status information. It is therefore possible to align the output torques on the single and common used time axis.

The preliminary and testing command values may be at least one of a reference torque, a reference current and a reference voltage. In this case, the reference torque represents a torque to be outputted by the specimen motor, the reference current represents a current determined in accordance with the reference torque and applied to the specimen motor, and the reference voltage denotes a voltage determined in accordance with the reference torque or the reference current and applied to the specimen motor. Actually, the use of reference current is preferable for executing the evaluation method.

The response delay information preferably includes at least one of: information denoting a response delay of the reference current relative to the reference torque; information denoting a response delay of the reference voltage relative to the reference current; information denoting a response delay of a motor current relative to a preliminary command correlative thereto; information denoting a response delay of a motor voltage relative to a preliminary command correlative thereto; information denoting a response delay of a control current relative to a preliminary command correlative thereto; and information denoting a response delay of a control voltage relative to a preliminary command correlative thereto. In this case, the motor current and voltage are a current and a voltage applied to the specimen motor, respectively. The control current and voltage are a current and a voltage applied to a control circuit for controlling the specimen motor respectively and converted to the motor current and voltage by the control circuit.

The operating status information preferably includes at least one of: an output torque of the specimen motor; a rotational speed of the specimen motor; a current flowing to the specimen motor; a voltage applied to the specimen motor; a current flowing to a control circuit for actuating the specimen motor; a voltage applied to the control circuit; and a temperature of a sensor for detecting an output torque of the specimen motor.

The specimen motor may be a motor for driving an electric vehicle, for example. A load may be applied to the specimen motor in the second step.

BRIEF DESCRIPTION OF THE DRAWINGS

The invention will be described in greater detail with reference to the accompanying drawings, wherein:

FIG. 7 is a flowchart showing a routine for measuring essential properties of a specimen motor;

FIG. 8A is a graph showing a correlation between a reference current and a motor current;

FIG. 8B is a graph showing a reaction of the motor current in response to a variation of the reference current;

FIG. 8C shows a correlation between the reference current or the motor current and torque, and temperature dependency of the torque;

FIG. 8D shows a correlation between the torque and the number of rotations of the specimen motor;

DESCRIPTION OF THE PREFERRED EMBODIMENT

The invention will be described with reference to a preferred embodiment shown in the accompanying drawings.

Figure 1:
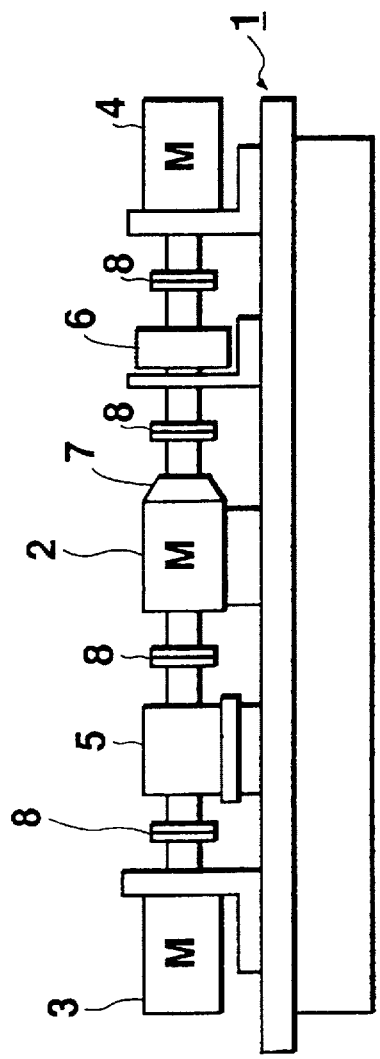
FIG. 1 is a schematic view showing an external appearance of an evaluator according to an embodiment of the invention.
Figure 2:
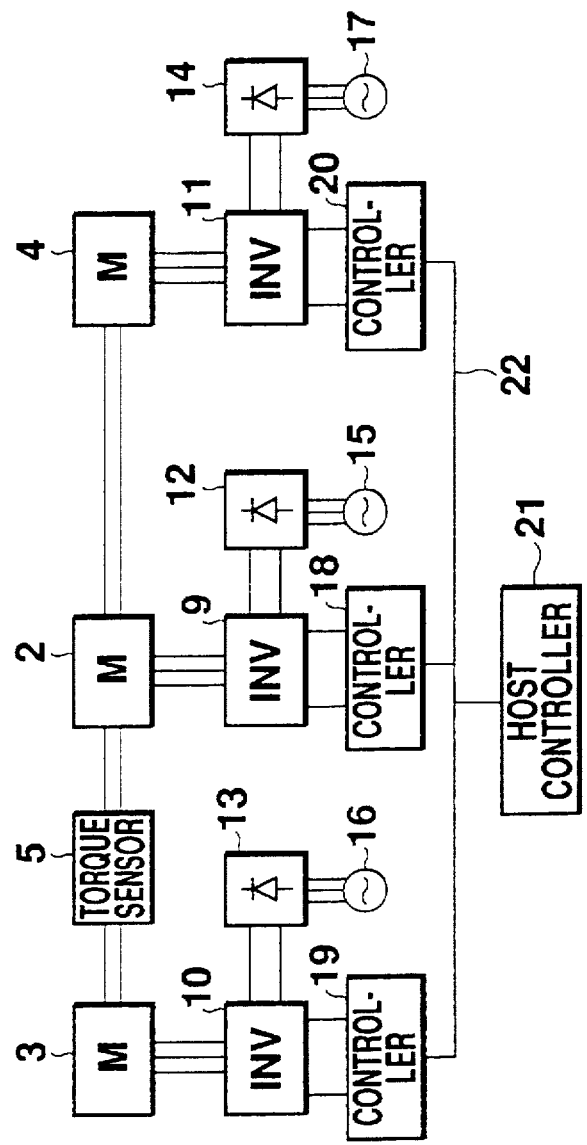
FIG. 2 is a block diagram showing the configuration of a drive control circuit used in the embodiment.
Figure 3:
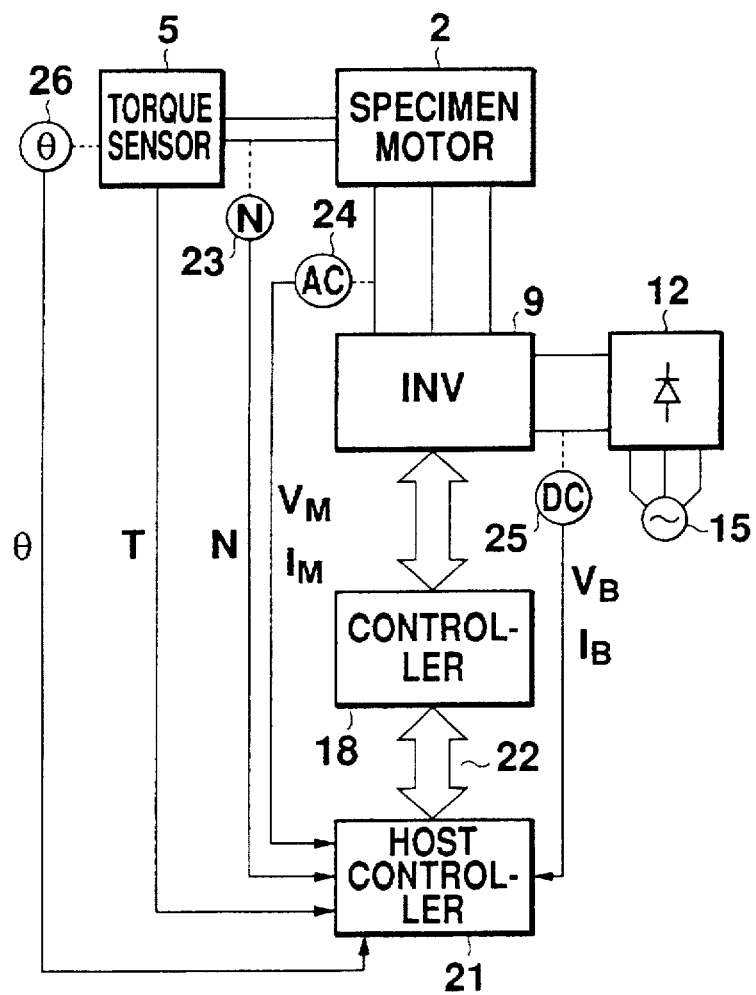
FIG. 3 is a block diagram showing the configuration of a measurement circuit used in the embodiment.

An evaluator 1 is configured as shown in FIGS. 1 to 3, and it examines a specimen motor 2 and evaluates properties of the specimen motor 2 by applying loads thereto from load motors 3 and 4. Referring to FIG. 1, a torque sensor 5 is disposed between the specimen motor 2 and the load motor 3 so as to detect an output torque of the specimen motor 2. The specimen motor 2 and the torque sensor 5 are coupled/decoupled to/from each other via a coupling 8, and the load motor 3 and the torque sensor 5 are likewise coupled/decoupled via another coupling 8. A flywheel 6 is disposed between the specimen motor 2 and the load motor 4 via couplings 8. A speed reduction mechanism 7 is provided between the specimen motor 2 and the flywheel 6 in addition to the coupling 8.

FIG. 2 shows a drive circuit applied to the evaluator 1 of FIG. 1. In the circuit of FIG. 2, the motors 2–4 are AC motors, which are actuated by alternating currents supplied by their associated inverters 9–11. On the basis of commands from controllers 18–20, the inverters 9–11 convert direct currents, supplied from rectifiers 12–14, into alternating currents. The rectifiers 12–14 rectify alternating currents from their associated AC sources 15–17. A host controller 21 provides reference torques to the controllers 18–20 via a bus cable 22, e.g. VME (Versa Module Europe) bus. These reference torques represent torques to be output by the motors 2–4, respectively. On the basis of the reference torques from the host controller 21, the controllers 18–20 generate reference currents to be applied t o the motors 2–4. The controllers 18–20 control the switching operation of the switching devices in their associated inverters 9–11 on the basis of the reference currents.

The host controller 21 provides the controllers 18–20 with various commands such as reference torques so that the specimen motor 2 is examined and evaluated according to predetermined test and evaluation conditions. Concurrently, the host controller 21 monitors statuses of the specimen motor 2 and so on. For this purpose, the torque sensor 5 is provided on an output shaft of the specimen motor 2, and a rotation sensor 23 such as a resolver is provided in the vicinity of the output shaft or a rotor of the specimen motor 2. An AC voltage-and-current sensor 24 and a DC voltage-and-current sensor 25 are respectively provided around AC wiring and DC wiring of the inverter 9. A temperature sensor 26 is provided in the vicinity of the torque sensor 5. The host controller 21 receives and collects the following data on the specimen motor 2 using a GPIB (General purpose interface board) or the like: an output torque T from the torque sensor 5; the number N of rotations from the rotation sensor 23; a current $I_M$ and a voltage $V_M$ (actually supplied to the specimen motor 2) from the AC voltage-and-current sensor 24; a current $I_B$ and a voltage $V_B$ (actually supplied to the inverter 9) from the DC voltage-and-current sensor 25; and a temperature $\theta$ of the torque sensor 5 from the temperature sensor 26.

Figure 4:
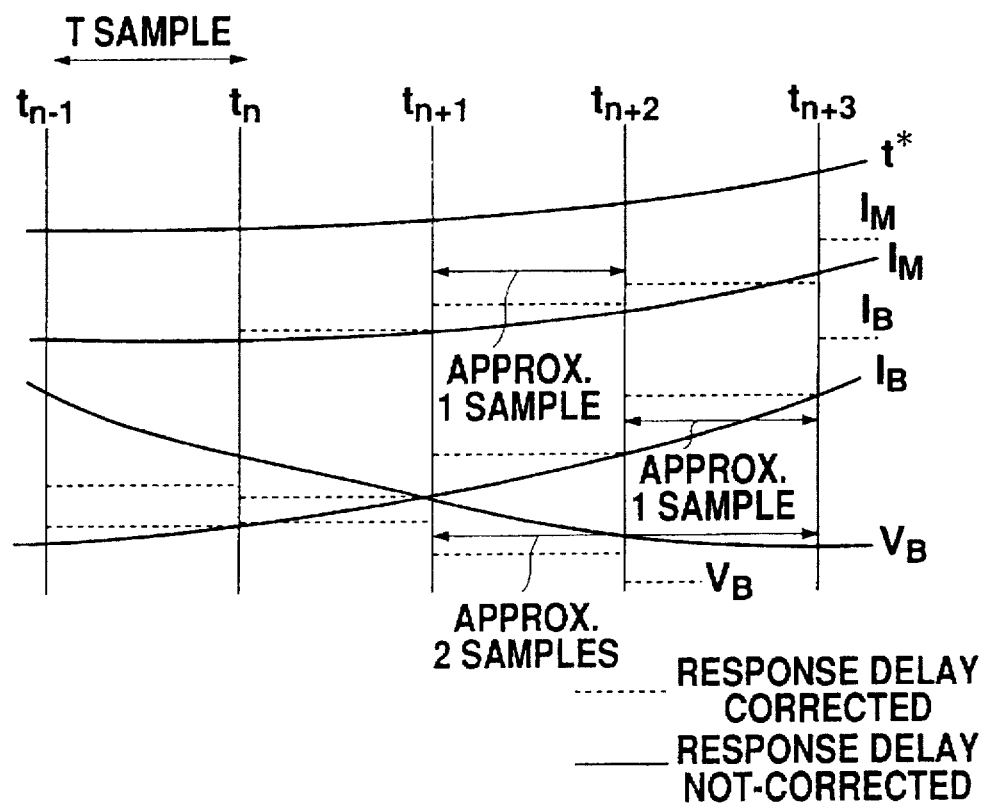
FIG. 4 is a time chart showing objects and advantageous results of the embodiment.

Properties which are collected by the host controller 21 for the evaluation or examination of the specimen motor 2 contain various kinds of delays as well as a response delay of the torque sensor 5. This denotes that a series of devices concerned with the control, actuation and measurement take some time to respond to commands. If a response delay is much shorter than an output cycle $T_{sample}$ of a command value, there will be no problem. However, when the command value should be output in a shorter output cycle $T_{sample}$ so as to evaluate a motor for driving an electric vehicle, delays are very problematic. For example, measured values of the current $I_M$, power supply current $I_B$ and voltage $V_B$ of the specimen motor 2 tend to contain errors due to response delays, as shown by the solid lines in FIG. 4. In this case, true values of these items are shown by the dashed lines. Therefore, in actuality, it is very difficult to evaluate or examine the specimen motor 2.

This embodiment enables correction of response delays. For example, since a response delay of the torque sensor 5 is caused by disturbances such as temperature and since sensors including the torque sensor 5 have their own peculiarities, it is usually difficult to estimate their response delays. However, in this embodiment, the essential properties of the system including not only the controlling and driving apparatus but also the sensors are measured taking a level of an influence of disturbances into consideration, prior to the evaluation and examination. Therefore, the response delays can be corrected so as to obtain the properties as shown by the dashed lines in FIG. 4. Preferably, as the time criteria for delay correction, a reference current I* to be supplied to the specimen motor 2, a reference voltage V* depending upon the reference current I*, or reference torque T* is used. With respect to the precision, the use of reference current I* is preferable. For instance, even if the reference torque T* remains constant, the reference current I* is continuously reflecting the status variation of the load motor 4 or the like, status variation of the specimen motor 2 caused by temperature variation, varying input voltage, and so on. Thus, more precise analyses can be performed using the reference current I*. In other words, it is most preferable to use the latest command value which is most influential on the motor currents.

Figure 5:
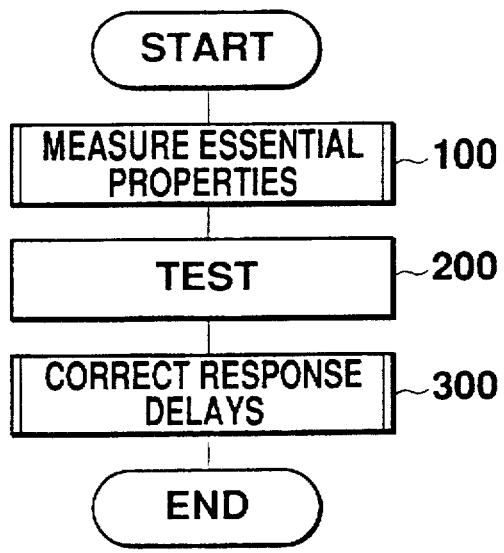
FIG. 5 is a flowchart showing an example of a processing routine.
Figure 6:
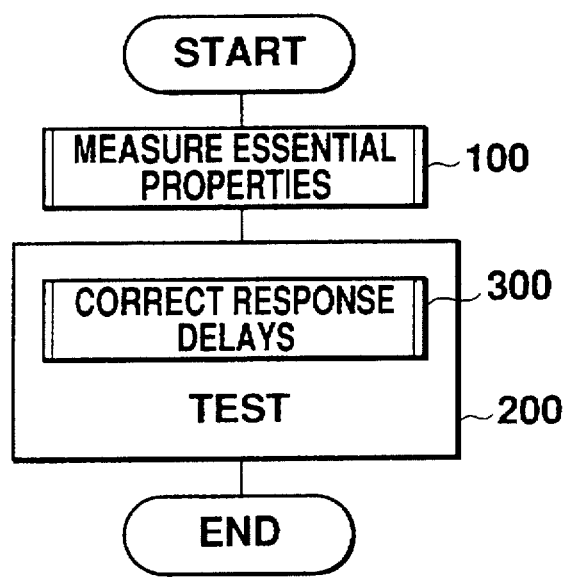
FIG. 6 is a flowchart showing another example of the processing routine.

FIGS. 5 and 6 show examples of evaluation and examination procedures. Referring to FIG. 5, the essential properties are measured (step 100) prior to the examination (step 200). In step 300, the properties measured and collected during the examination are corrected (i.e. response delays are corrected) on the basis of the preliminarily measured essential properties. This procedure assures advantageous results of this embodiment without any modification of testing software. In the example of FIG. 6, response delays are simultaneously corrected using properties which are being sequentially measured during the examination. Thus, the advantageous results of this embodiment can be offered without a step for separately correcting the response delays after the examination. In both the procedures shown in FIGS. 5 and 6, a previous step may be shifted to a succeeding step automatically or manually. The data which are collected in synchronization with the command values can be corrected later by measuring the properties.

Figure 8A:
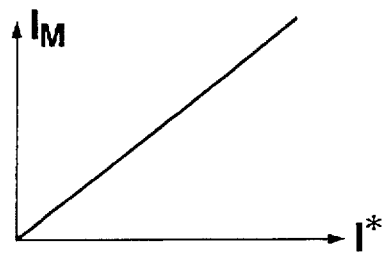
FIGS. 8A to 8D show data obtained by the essential property measurement.

The essential properties are measured in accordance with the procedure shown in FIG. 7. First of all, a correlation between the reference current I* and the current $I_M$ is measured (step 101). Namely, the host controller 21 repeats, for a predetermined number of times, a procedure in which the reference current I* is determined and output by the controller 18, the current $I_M$ becomes sufficiently stable thereafter, and the current $I_M$ is then measured. This measurement is repeated by varying the reference current I*. Through the repetitive measurement, the host controller 21 generates information <I*–$I_M$> denoting the correlation between the reference current I* and the current $I_M$, as shown in FIG. 8A.

Figure 8B:
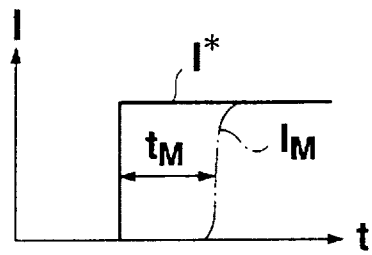

A step response of the current $I_M$ to a stepwise variation of the reference current I* is then measured (step 102). Strictly speaking, the controller 18 stepwisely changes the reference current I* and the host controller 21 monitors the length of time $t_M$ which lapses before the current $I_M$ varies with the varying reference current I* (refer to FIG. 8B). By this measurement, the host controller 21 generates information <ΔI*–Δ$I_M$> representing a variation of the current $I_M$ in response to the variation of the reference current I*. The time $t_M$ is collected as an integer m which is derived by dividing the time $t_M$ into the cycle $T_{sample}$, which is synchronous with a cycle $T_1$ of the reference current I*, and by rounding a quotient up or down. Likewise, in step 102, the following data are collected and generated; <ΔI*–ΔV*>, i.e. time delay data n, representing a response of V* (or $V_M$) to the varying reference current I*; <ΔI*–Δ$I_B$>, time delay data q, representing a response of $I_B$ to I*; and <ΔI*–Δ$V_B$>, i.e. time delay data q, representing a response of $V_B$ to I*. Alternatively, $V_M$ may be detected in place of V*. However, since it is difficult to measure $V_M$ accurately, V* is preferable.

Figure 8C:
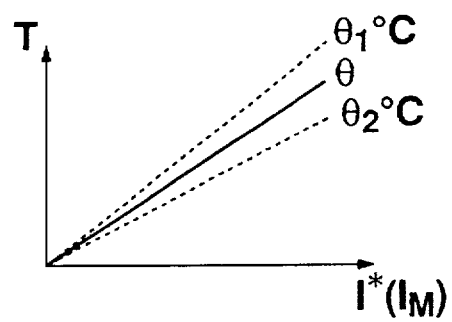

Further, a correlation between the reference current I* and torque T is measured (step 103). Namely, after the reference current I* is determined and output by the controller 18, the host controller 21 waits until the torque T becomes sufficiently stable. Thereafter, the host controller 21 measures the torque T. The host controller 21 repeats the process a predetermined number of times, by varying the reference current I*. Further, since the torque sensor 5 has temperature characteristics, the correlation between the reference current I* and the torque T is measured while correcting temperature drift of the torque sensor 5 depending upon its temperature θ. The temperature drift is corrected using the formula:

(True value)=(measured value)/{1+0.03×(θ–$θ_1$)/100} where θ denotes a temperature (deg), and $θ_1$ denotes a reference temperature (deg). Since the torque T represents information reflecting the temperature θ as disturbances, it can be expressed as T(θ). Thus, the host controller 21 obtains information <I*–T(θ)> denoting the correlation between the reference current I* and the torque T as shown in FIG. 8C. In other words, the host controller 21 obtains the information, in cooperation with the information obtained in steps 101 and 102, <I*–$I_M$ etc.–N–T(θ)>. Alternatively, the correlation to be obtained in this step may be a correlation between the current $I_M$ and the torque T.

Figure 8D:
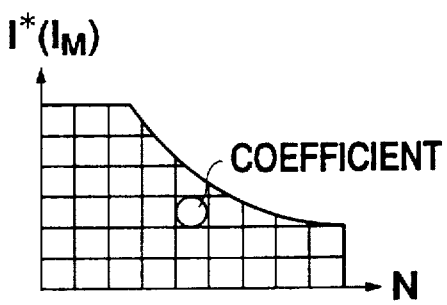

The specimen motor 2 has output characteristics that are represented by an I* (or $I_M$)–N map shown in FIG. 8D. Specifically, an upper limit of the output torque T of the specimen motor 2 is restricted by a maximum torque line when the number N of rotations is low. Conversely, the upper limit of the output torque T is restricted by a maximum output line (a maximum line of a product of the torque T and the number N of rotations). Thus, the host controller 21 executes step 103 with respect to respective points on the I* (or $I_M$)–N map, i.e. all the combinations of the torque T to be output and the number N of rotations, and associates the number N of rotations with the existing information (step 104). Further, the host controller 21 determines a coefficient α using the relationship T=αI* (step 105), thereby associating the torque T with the reference current I*. The information <I*–$I_M$ etc.–N–T(θ)> is thus obtained.

Then, the host controller 21 stores, as the essential properties, information concerning the response delays m, n, p, q and so on, i.e. information representing the correlations between I*, $I_M$, N, T(θ), V*, $I_B$, and $V_B$, in an external recording medium (such as a hard disc) in the host controller 21, or in an external recording medium (such as a diskette) outside the host controller 21 (step 106). Therefore, the stored essential properties include not only the properties of the specimen motor 2 but also those of the drive, control and measuring systems, and disturbances such as the temperature θ.

Figure 9:
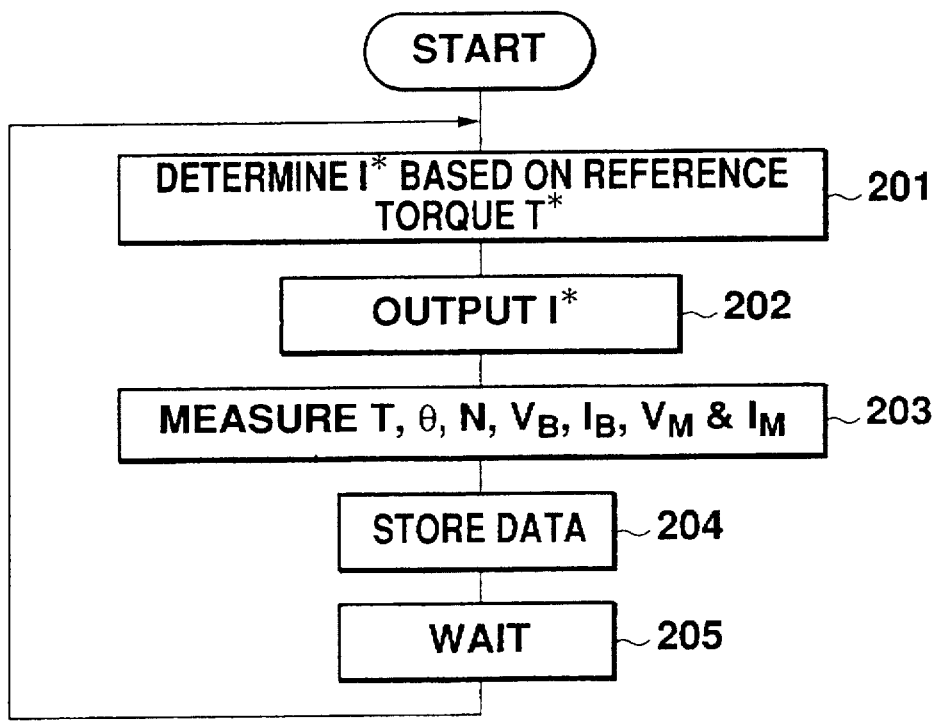
FIG. 9 is a flowchart showing a test procedure in the embodiment.

FIG. 9 shows an example of an examination procedure. In response to the reference torque from the host controller 21, the controllers 18 to 20 determine reference currents I* (step 201), and output them to their associated inverters 9–11 (step 202). The host controller 21 uses the sensors shown in FIG. 3 so as to detect statuses of the specimen motor 2 and evaluator 1 (step 203), and stores obtained data in the external recording medium internal or external to itself (step 204). The host controller 21 and controllers 18 to 20 repeat the foregoing operation for each cycle $T_{sample}$ which is synchronous with the command cycle $T_1$ of the reference current I* or each cycle $T_1$ of the command I* (step 205).

Figure 10:
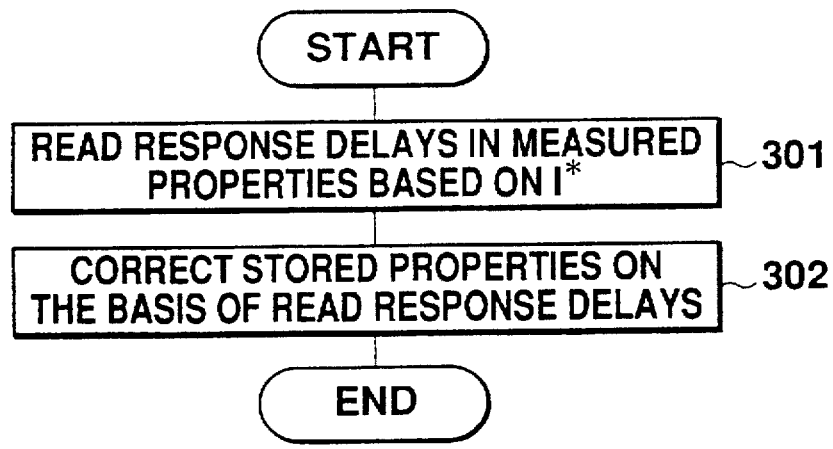
FIG. 10 is a flowchart showing a response delay correcting procedure.

The measured values containing response delays are corrected in accordance with the procedure shown in FIG. 10. The response delays m, n, p and q in the measured properties $I_M$, V*, $I_B$ and $V_B$ are read using the reference currents I* as time criteria (step 301). In other words, in this embodiment the host controller 21 refers to the essential properties which have been preliminarily measured and stored in step 106. Thus, obtained information includes the response delays m, n, p and q in the actually measured data, each of which represents the response delay when the reference current I* is applied as the time criteria.

Figure 11:
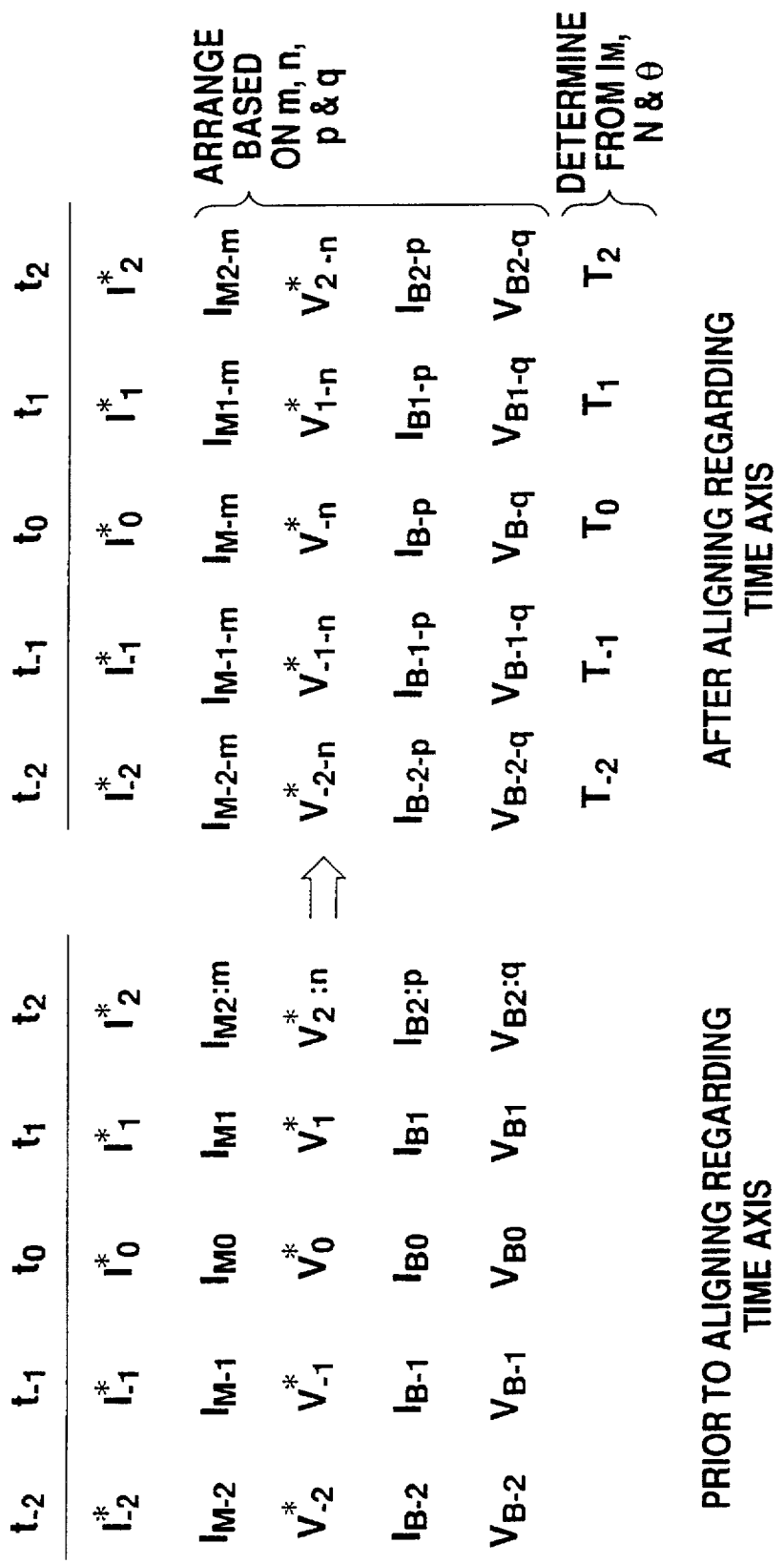
FIG. 11 shows a concept of correcting measured and stored properties.
Figure 12:
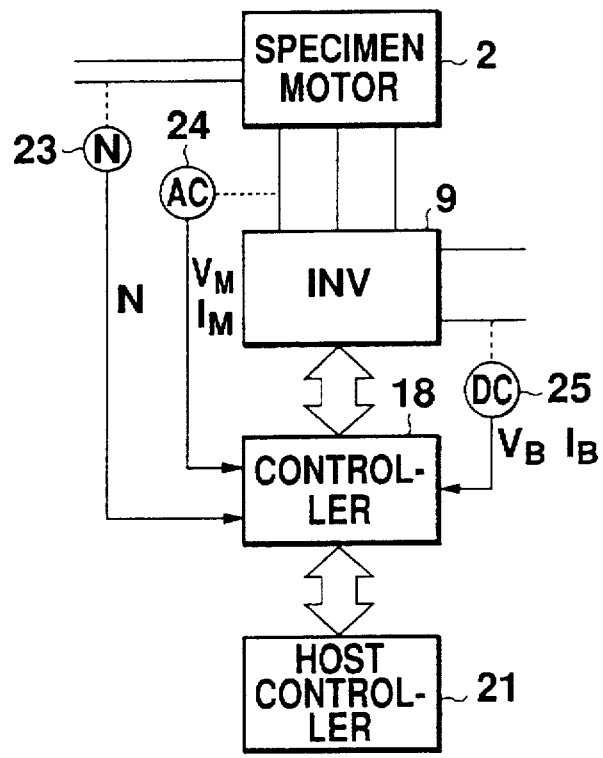
FIG. 12 is a block diagram showing the configuration of a modified measurement circuit.

The host controller 21 corrects the measured properties $I_M$, $V^*$, $I_B$ and $V_B$ (which have been stored in step 204) using the read response delays m, n, p and q (step 302). In actuality, the host controller 21 corrects recording addresses or sectors of the measured properties $I_M$, $V^*$, $I_B$ and $V_B$ in accordance with the response delays, thereby making these properties associated with the reference currents I* which have caused the response delays, as shown in FIG. 11. In this manner, the response delays in the specimen motor 2 and the evaluator 1 are corrected in accordance with the reference currents I* such that the properties $I_M$, $V^*$, $I_B$ and $V_B$ are aligned on a single time axis of the reference currents I*. Concurrently, the host controller 21 derives the output torque T on the basis of not only the corrected $I_M$ but also the detected number N of rotations and the temperature θ. Thus, the host controller 21 can obtain the output torque T which is aligned on the time axis of the reference currents I*.

Alternatively, the host controller 21 can collect various data in the following manner. Data actually detected by the sensors such as the rotational speed sensor 23, the AC voltage-and-current sensor 24, and the DC voltage-and-current sensor 25 whose outputs are used to control the inverter are utilized as measured values. The data on the measured properties are directly sampled in the controllers 18 to 20 for the inverters 9 to 11. Thereafter, the host controller 21 can collect the sampled data. In this case, since data are collected in the controllers 18 to 20 which have calculated the reference currents I*, it becomes very easy to synchronize the sampled data with the cycles of the reference currents I*. When this system is employed, the test is preferably performed in accordance with the procedure shown in FIG. 6. In other words, the controller 18 collects various data while testing the specimen motor 2. In such a case, delay correction is performed prior to the step 204 shown in FIG. 9 such that the data are stored after the time base is adjusted to the foregoing criteria.

A reference torque and a reference voltage, or any combination of the reference torque, reference current and reference voltage, may be used as the criteria of the time base in place of the reference current. In addition to the foregoing response delay data, the following data may be used, e.g. data presenting how long the reference current takes to vary with a varying reference torque, or data representing how long a motor current, a motor voltage, an input current or a voltage of the inverter takes to vary with a varying reference torque or voltage. Although these are not shown, they will be obvious to one skilled in the art on the basis of the specification.

What is claimed is:

1. A method for processing original measurement data on a specimen motor, the original measurement data representing an operating status of the specimen motor when the specimen motor is actuated in response to periodically issued operating testing commands, the method comprising the steps of:

collecting, through a preparatory test prior to the periodically issued operating testing commands, preparatory response delay information representing a delay in operation timings of the specimen motor with respect to issued timings of corresponding preparatory testing commands; and generating motor evaluation data by compensating the original measurement data with the preparatory response delay information.

2. The method according to claim 1, wherein the testing commands include at least one of a reference torque, a reference current and a reference voltage, respectively, the reference torque representing a torque to be output by the specimen motor, the reference current representing a current determined in accordance with the reference torque and applied to the specimen motor, and the reference voltage representing a voltage determined in accordance with the reference torque or the reference current and applied to the specimen motor.

3. The method according to claim 2, wherein the response delay information includes at least one of:

information denoting a response delay of the reference current relative to the reference torque;

information denoting a response delay of the reference voltage relative to the reference current;

information denoting a response delay of a motor current relative to a testing command correlative thereto;

information denoting a response delay of a motor voltage relative to a testing command correlative thereto;

information denoting a response delay of a control current relative to a testing command correlative thereto; and information denoting a response delay of a control voltage relative to a testing command correlative thereto, wherein the motor current and voltage are a current and a voltage, respectively, actually applied to the specimen motor and wherein the control current and voltage are a current and a voltage, respectively, applied to a control circuit for controlling the specimen motor respectively and converted to the motor current and voltage by the control circuit.

4. The method according to claim 1, wherein the operating status includes at least one of:

an output torque of the specimen motor;

a rotational speed of the specimen motor;

a current flowing to the specimen motor;

a voltage applied to the specimen motor;

a current flowing to a control circuit for actuating the specimen motor;

a voltage applied to the control circuit; and a temperature of a sensor for detecting an output torque of the specimen motor.

5. The method according to claim 1, wherein the specimen motor is a motor for driving an electric vehicle.

6. The method according to claim 1, wherein a load is applied to the specimen motor by a load motor in the step of generating motor evaluation data.

7. A system for processing original measurement data on a specimen motor, the original measurement data representing an operating status of the specimen motor when the specimen motor is actuated in response to periodically issued operating testing commands, comprising:

means for collecting, through a preparatory test prior to the periodically issued operating testing commands, preparatory response delay information representing a delay in operation timings of the specimen motor with respect to issued timings of corresponding preparatory testing commands; and means for generating motor evaluation data by compensating the original measurement data with the preparatory response delay information.

8. The system according to claim 7, wherein the testing commands include at least one of a reference torque, a reference current and a reference voltage, respectively, the reference torque representing a torque to be output by the specimen motor, the reference current representing a current determined in accordance with the reference torque and applied to the specimen motor, and the reference voltage representing a voltage determined in accordance with the reference torque or the reference current and applied to the specimen motor.

9. The method according to claim 8, wherein the response delay information includes at least one of:

information denoting a response delay of the reference current relative to the reference torque;

information denoting a response delay of the reference voltage relative to the reference current;

information denoting a response delay of a motor current relative to a testing command correlative thereto;

information denoting a response delay of a motor voltage relative to a testing command correlative thereto;

information denoting a response delay of a control current relative to a testing command correlative thereto; and information denoting a response delay of a control voltage relative to a testing command correlative thereto, wherein the motor current and voltage are a current and a voltage, respectively, actually applied to the specimen motor and wherein the control current and voltage are a current and a voltage, respectively, applied to a control circuit for controlling the specimen motor respectively and converted to the motor current and voltage by the control circuit.

10. The method according to claim 7, wherein the operating status includes at least one of:

an output torque of the specimen motor;

a rotational speed of the specimen motor;

a current flowing to the specimen motor;

a voltage applied to the specimen motor;

a current flowing to a control circuit for actuating the specimen motor;

a voltage applied to the control circuit; and a temperature of a sensor for detecting an output torque of the specimen motor.

11. The method according to claim 7, wherein the specimen motor is a motor for driving an electric vehicle.

12. The method according to claim 7, wherein a load is applied to the specimen motor by a load motor.

\* \* \* \* \*